(12) United States Patent
Namuduri et al.

(10) Patent No.: US 11,970,078 B2
(45) Date of Patent: Apr. 30, 2024

(54) VEHICLE ACCESSORY LOAD CONTROL AND POWER STABILITY

(71) Applicant: GM Global Technology Operations LLC, Detroit, MI (US)

(72) Inventors: Chandra S. Namuduri, Troy, MI (US); Suresh Gopalakrishnan, Troy, MI (US); Lyall Kenneth Winger, Waterloo (CA)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 76 days.

(21) Appl. No.: 17/901,966

(22) Filed: Sep. 2, 2022

(65) Prior Publication Data
US 2024/0075846 A1    Mar. 7, 2024

(51) Int. Cl.
*B60L 58/12* (2019.01)
*B60L 1/02* (2006.01)
*B60L 53/20* (2019.01)
*G01R 31/3842* (2019.01)
*G01R 31/389* (2019.01)
*H02J 7/00* (2006.01)

(52) U.S. Cl.
CPC ............. *B60L 58/12* (2019.02); *B60L 1/02* (2013.01); *B60L 53/20* (2019.02); *G01R 31/3842* (2019.01); *G01R 31/389* (2019.01); *H02J 7/0048* (2020.01); *H02J 7/0063* (2013.01); *B60L 2210/10* (2013.01); *B60L 2240/545* (2013.01); *B60L 2240/547* (2013.01); *B60L 2240/549* (2013.01); *H02J 2207/20* (2020.01)

(58) Field of Classification Search
CPC .. B60L 58/12; B60L 53/20; B60L 1/02; B60L 2210/10; B60L 2240/545; B60L 2240/549; G01R 31/389; H02J 7/0048; H02J 2207/20
See application file for complete search history.

(56) References Cited

U.S. PATENT DOCUMENTS

| | | | |
|---|---|---|---|
| 11,289,929 B2 * | 3/2022 | Nedjimi | H02J 7/0048 |
| 2004/0135546 A1 * | 7/2004 | Chertok | B60L 58/18 320/118 |
| 2017/0120773 A1 * | 5/2017 | Zhang | H01M 10/0525 |
| 2023/0139177 A1 * | 5/2023 | Regazzi | H02J 7/14 320/165 |
| 2023/0387795 A1 * | 11/2023 | Örnberg | B60L 1/00 |

* cited by examiner

*Primary Examiner* — Jared Fureman
*Assistant Examiner* — Duc M Pham
(74) *Attorney, Agent, or Firm* — CANTOR COLBURN LLP

(57) ABSTRACT

A system in a vehicle includes memory to store values obtained for a battery that supplies current to one or more loads. The values include battery state of charge. A processor obtains a measured battery current from a battery current sensor and a measured total current from a current sensor at a battery center that supplies the current directly to the one or more loads, obtain a generator current or a direct current-to-direct current (DC-DC) converter current from the measured total current and the battery current, determine a maximum available current as a sum of a maximum available battery current and either the generator current or the DC-DC converter current, and stop a supply of the current to one or more of the one or more loads based on a result of a comparison of the maximum available current with current draw by the one or more loads.

20 Claims, 4 Drawing Sheets

VEHICLE ACCESSORY LOAD CONTROL AND POWER STABILITY

INTRODUCTION

The subject disclosure relates to vehicle accessory load control and power stability.

Vehicles (e.g., automobiles, trucks, construction equipment, farm equipment) may be gasoline or diesel-powered or may be electric or hybrid. Regardless of the power source for the propulsion system of a vehicle, the power source for accessory loads is generally a battery. In a gasoline, diesel, or hybrid vehicle, a battery and a generator that charges the battery may be used. In an electric vehicle, a battery and a direct current-to-direct current (DC-DC) converter to charge the battery may be used. The maximum available output power of the battery and generator or battery and DC-DC converter determines power stability for the loads. Accordingly, it is desirable to provide vehicle accessory load control and power stability.

SUMMARY

In one exemplary embodiment, a system in a vehicle includes memory to store values obtained for a battery that supplies current to one or more loads of the vehicle. The values include state of charge (SoC) of the battery. The system also includes a processor to obtain a measured battery current from a current sensor of the battery and a measured total current from a current sensor at a battery center that supplies the current directly to the one or more loads, to obtain a generator current or a direct current-to-direct current (DC-DC) converter current from the measured total current and the battery current, to determine a maximum available current as a sum of a maximum available battery current and either the generator current or the DC-DC converter current, and to stop a supply of the current to one or more of the one or more loads based on a result of a comparison of the maximum available current with current draw by the one or more loads.

In addition to one or more of the features described herein, the processor determines the maximum available battery current $I_{bmax}$ based on battery internal resistance $R_{internal}$ and battery internal voltage $V_{oc}$ as:

$$I_{bmax} = \frac{V_{OC}}{2 * R_{internal}}.$$

In addition to one or more of the features described herein, the processor obtains values of the battery internal resistance $R_{internal}$ and the battery internal voltage $V_{oc}$ from look-up tables based on current values of the SoC the p, temperature, and voltage.

In addition to one or more of the features described herein, the vehicle is gasoline or diesel-powered and the generator current is obtained as the battery current subtracted from the measured total current.

In addition to one or more of the features described herein, the vehicle is a hybrid vehicle and the DC-DC converter current is obtained as the battery current subtracted from the measured total current.

In addition to one or more of the features described herein, the vehicle is an electric vehicle and the DC-DC converter current is obtained as the battery current subtracted from the measured total current.

In addition to one or more of the features described herein, the processor associates a priority associated with each of the one or more loads.

In addition to one or more of the features described herein, the processor stops the supply of the current to one or more of the one or more loads based on the result of the comparison of the maximum available current with current draw by the one or more loads indicating that the maximum available current is less than the current draw by the one or more loads.

In addition to one or more of the features described herein, the processor selects the one or more of the one or more loads based on the priority associated with the one or more of the one or more loads.

In addition to one or more of the features described herein, the processor continues the supply of the current to others of the one or more loads, other than the one or more of the one or more loads, based on the others of the one or more loads affecting safety of the vehicle.

In another exemplary embodiment, a non-transitory computer-readable medium stores instructions that, when processed by a processor, cause the processor to implement a method in a vehicle. The method includes obtaining a measured battery current from a current sensor of the battery and a measured total current from a current sensor at a battery center configured to supply the current directly to one or more loads. The method also includes obtaining a generator current or a direct current-to-direct current (DC-DC) converter current from the measured total current and the measured battery current, determining a maximum available current as a sum of a maximum available battery current and either the generator current or the DC-DC converter current, and controlling a stop of supply of the current to one or more of the one or more loads based on a result of a comparison of the maximum available current with current draw by the one or more loads.

In addition to one or more of the features described herein, the method includes determining the maximum available battery current $I_{bmax}$ based on battery internal resistance $R_{internal}$ and battery internal voltage $V_{oc}$ as:

$$I_{bmax} = \frac{V_{OC}}{2 * R_{internal}}.$$

In addition to one or more of the features described herein, the method includes obtaining values of the battery internal resistance $R_{internal}$ and the battery internal voltage $V_{oc}$ from look-up tables based on current values of the SoC the p, temperature, and voltage.

In addition to one or more of the features described herein, the method includes obtaining the generator current as the battery current subtracted from the measured total current in a gasoline or diesel-powered vehicle.

In addition to one or more of the features described herein, the method includes obtaining the DC-DC converter current as the battery current subtracted from the measured total current in a hybrid vehicle.

In addition to one or more of the features described herein, the method includes obtaining the DC-DC converter current as the battery current subtracted from the measured total current in an electric vehicle.

In addition to one or more of the features described herein, the method includes associating a priority with each of the one or more loads.

In addition to one or more of the features described herein, the method includes stopping the supply of the current to one or more of the one or more loads based on the result of the comparison of the maximum available current with current draw by the one or more loads indicating that the maximum available current is less than the current draw by the one or more loads.

In addition to one or more of the features described herein, the method includes selecting the one or more of the one or more loads based on the priority associated with the one or more of the one or more loads.

In addition to one or more of the features described herein, the method includes continuing the supply of the current to others of the one or more loads, other than the one or more of the one or more loads, based on the others of the one or more loads affecting safety of the vehicle.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
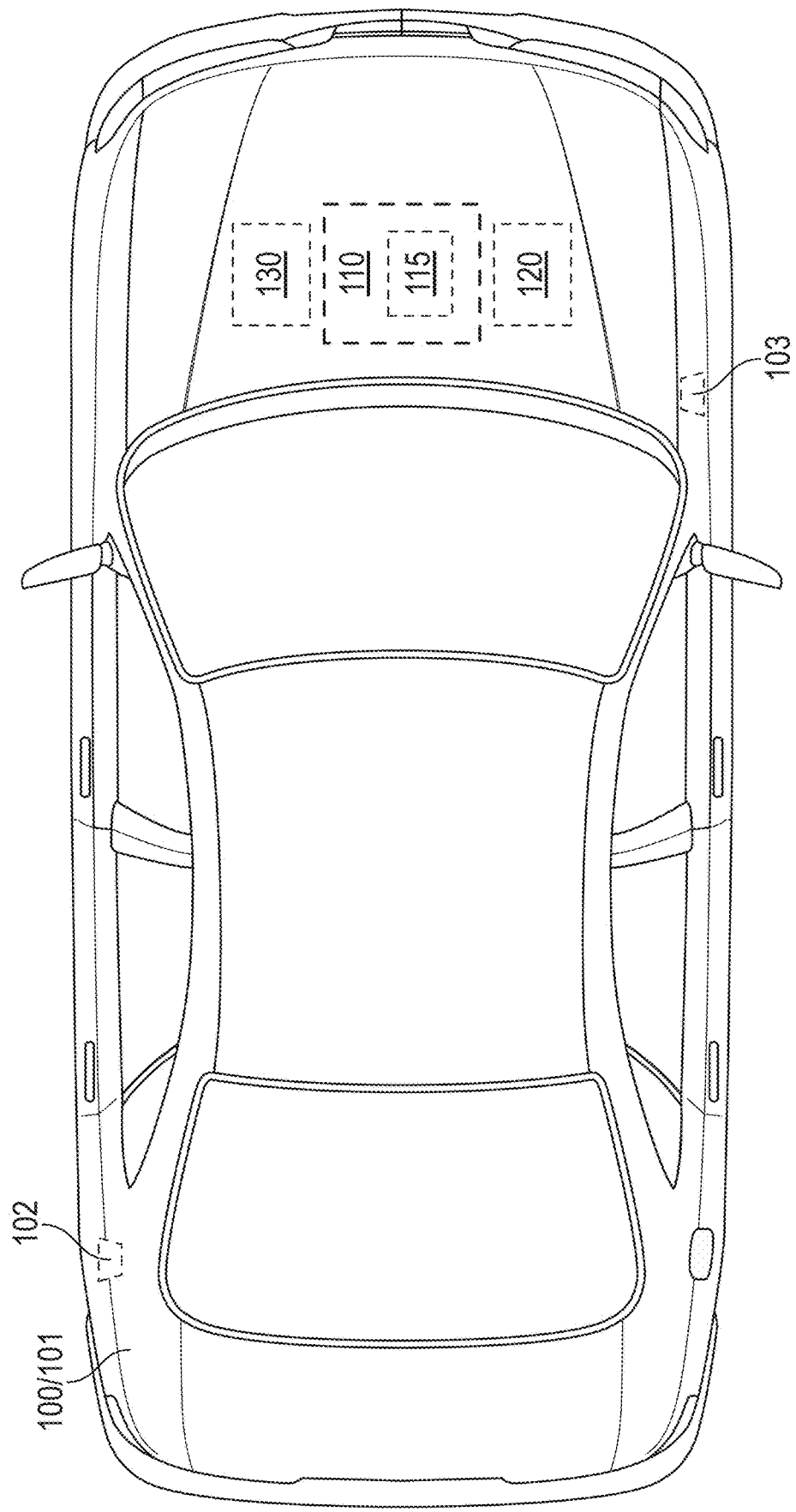
FIG. 1 is a block diagram of a vehicle that implements accessory load control and power stability according to one or more embodiments.

The following description is merely exemplary in nature and is not intended to limit the present disclosure, its application or uses. It should be understood that throughout the drawings, corresponding reference numerals indicate like or corresponding parts and features.

Embodiments of the systems and methods detailed herein relate to vehicle accessory load control and power stability. As previously noted, accessory loads (e.g., air conditioning, infotainment system, navigation) are powered by a battery (e.g., 12 volt (V) battery) that is recharged via a generator in gasoline or diesel vehicles and are powered by a battery that is recharged via a DC-DC converter in hybrid and electric vehicles. The maximum available output power refers to the output of the combination of the battery with either the generator or the DC-DC converter. This maximum available output power indicates whether all the loads of the vehicle can be supported. If not, mitigating actions may be required. For example, if it is known that the maximum available output power is insufficient, then predictive load shedding may be implemented to ensure that more critical loads (e.g., related to safety systems) are powered while less critical loads (e.g., related to convenience systems) are turned off.

The maximum current capability of the battery is a function of its voltage, state of charge (SoC), and temperature. Typically, a current sensor is disposed at the battery. The sensed current and the voltage of the battery indicate the maximum available output power from the battery at any given time. However, the generator or DC-DC converter may not have an associated current sensor. Thus, the maximum available output power of the generator or DC-DC converter and, consequently, the total maximum available output power for loads is typically not known. According to one or more embodiments, a current sensor is included in the battery electric center (BEC) that includes switches and fuses to control current supply to the various loads. As detailed, this current sensor is used to determine the maximum available output power available to the loads to facilitate accessory load control and to ensure power stability.

In accordance with an exemplary embodiment, FIG. 1 is a block diagram of a vehicle 100 that implements accessory load control and power stability. The exemplary vehicle 100 is an automobile 101 and, according to alternate embodiments, may be a conventional (i.e., gasoline or diesel-powered), hybrid, or electric vehicle 100. That is, the vehicle 100 may include a port 102 for intake of gasoline or diesel fuel. Alternately (in the case of an EV) or additionally (in the case of a plug-in-hybrid), the vehicle 100 may include a port 103 for an external battery charger. The power distribution system 110 of the vehicle 100 and the loads 130 supplied by the power distribution system 110 are indicated. The power distribution system 110 may include a controller 115.

In addition, the vehicle 100 may include a vehicle controller 120 that aspects of vehicle operation and may additionally control aspects of the power distribution system 110. For example, the vehicle 100 may include semi-autonomous or autonomous systems. The controller 115 of the power distribution system 110 and the vehicle controller 120 may include processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality. The memory of the processing circuitry may include a non-transitory computer-readable medium that stores instructions that, when processed by one or more processors of the processing circuitry, implement processes detailed herein.

Figure 2:
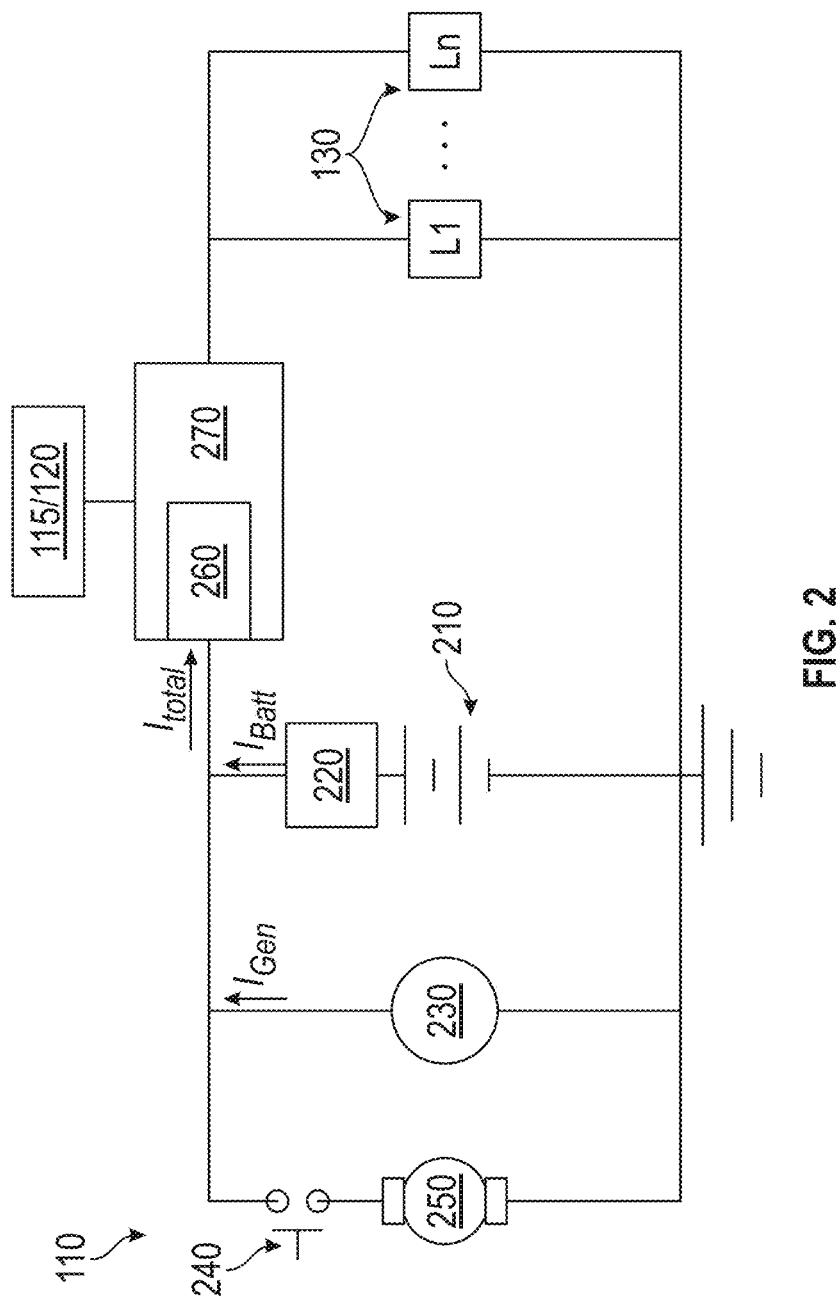
FIG. 2 is a schematic diagram of an exemplary power distribution system of the vehicle that implements accessory load control and power stability according to one or more embodiments.

FIG. 2 is a schematic diagram of an exemplary power distribution system 110 of the vehicle 100 that implements accessory load control and power stability according to one or more embodiments. The controller 115 and/or vehicle controller 120 are indicated and may obtain values, as detailed, alone or in combination. The exemplary vehicle 100 with the exemplary power distribution system 110 shown in FIG. 2 is a gasoline or diesel-powered vehicle 100. As such, the vehicle 100 includes a starter motor 250 that is connected, via a relay 240, to a battery 210 and a generator 230 to charge the battery 210.

In addition to being used by the starter motor 250, when the vehicle 100 is turned on, the battery 210 supplies one or more loads 130 (indicated as L1 through Ln). The values for the battery internal voltage $V_{oc}$ (i.e., the open circuit voltage) and the battery internal resistance $R_{internal}$ may be used, by the controller 115 and/or vehicle controller 120, to determine the maximum available battery current $I_{bmax}$ and battery power $P_{bmax}$ from the battery 210 as:

$$I_{bmax} = \frac{V_{OC}}{2 * R_{internal}} \quad [\text{EQ. 1}]$$

$$P_{bmax} = \frac{V_{OC}^2}{2 * R_{internal}} \quad [\text{EQ. 2}]$$

The values for the battery internal voltage $V_{oc}$ and the battery internal resistance $R_{internal}$ may be obtained from look-up tables based on the current known values of SoC, voltage ($V_{Batt}$), and temperature of the battery 210. The memory included in the controller 115 or vehicle controller 120 may store these current values, as well as the look-up tables. An integrated battery sensor 220 may be used to sense the battery current $I_{Batt}$ flowing from the battery 210. Based on this battery current $I_{Batt}$ and the known current voltage of the battery 210, current battery output power $P_{bout}$ of the battery 210 may be determined as:

$$P_{bout} = I_{Batt} * V_{Batt} \quad [\text{EQ. 3}]$$

A generator 230 charges the battery 210. As previously noted, there is no current sensor that directly senses the generator current $I_{Gen}$ flowing from the generator 230. Instead, according to one or more embodiments, a current sensor 260 is included in the BEC 270 that controls power supply to the loads 130. The controller 115 may be part of the BEC 270, as well. The current sensor 260 measures total current $I_{total}$ resulting from the battery current $I_{Batt}$ and the generator current $I_{Gen}$. Thus, the generator current $I_{Gen}$ may be determined as:

$$I_{Gen} = I_{total} - I_{Batt} \quad [\text{EQ. 4}]$$

From this generator current $I_{Gen}$ and the known generator voltage $V_{Gen}$, the current generator output power $P_{gout}$ of the generator 230 may be determined, by the controller 115 and/or the vehicle controller 120, as:

$$P_{gout} = I_{Gen} * V_{Gen} \quad [\text{EQ. 5}]$$

The maximum available generator current $I_{gmax}$ and generator power $P_{gmax}$ from the generator 230 may be obtained from look-up tables, mathematical functions, or from a supplier and are based on the generator voltage $V_{Gen}$, the temperature, field duty cycle, and rotational speed of the generator 230.

Figure 3:
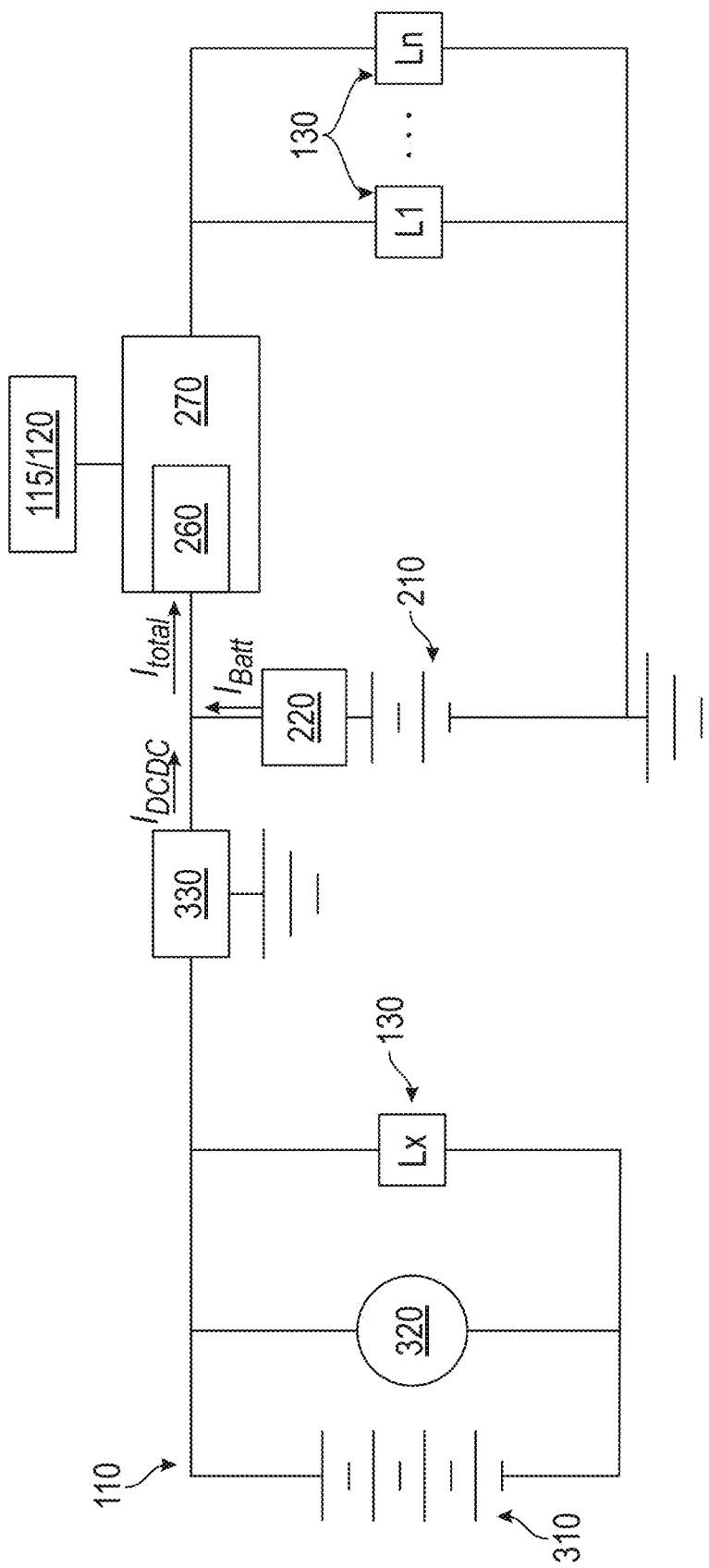
FIG. 3 is a schematic diagram of an exemplary power distribution system of the vehicle that implements accessory load control and power stability according to one or more embodiments.

FIG. 3 is a schematic diagram of an exemplary power distribution system 110 of the vehicle 100 that implements accessory load control and power stability according to one or more embodiments. The controller 115 and/or vehicle 120 are indicated and may obtain values, as detailed, alone or in combination. The exemplary vehicle 100 with the exemplary power distribution system 110 shown in FIG. 3 is an EV. The power distribution system 110 includes a high voltage rechargeable energy storage system (RESS) 310 that may include one or more battery packs, for example. A traction power inverter module (TPIM) 320 converts energy from the RESS 310 to drive one or more motors of the drivetrain to propel the electric vehicle 100. A DC-DC converter 330 converts energy from the RESS 310 to charge the battery 210 that supplies constant power and constant resistance to loads 130 L1 through Ln. As shown, one or more high voltage loads 130 Lx may be supplied by the RESS 310 without need for the DC-DC converter 330.

As discussed with reference to FIG. 2 and shown in FIG. 3, an integrated battery sensor 220 may be used to sense the battery current $I_{Batt}$ flowing from the battery 210. Thus, EQ. 3 may be used, along with the value of the battery voltage $V_{Batt}$ to determine the current output power $P_{bout}$ of the battery 210. The determination may be done by the controller 115 and/or vehicle controller 120. In addition, the maximum available battery current $I_{bmax}$ and battery power $P_{bmax}$ from the battery 210 may be determined using EQS. 1 and 2 with values for the battery internal voltage Vo, and the battery internal resistance R internal obtained from look-up tables based on the current known values of SoC, voltage ($V_{Batt}$), and temperature of the battery 210.

As also discussed with reference to FIG. 2 and shown in FIG. 3, a current sensor 260 is included in the BEC 270 that controls power supply to the loads 130 from the battery 210. The current sensor 260 measures total current $I_{total}$ resulting from the battery current $I_{Batt}$ and the DC-DC converter current $I_{DCDC}$ from the DC-DC converter 330. Thus, the DC-DC converter current $I_{DCDC}$ may be determined as:

$$I_{DCDC} = I_{total} - I_{Batt} \quad [\text{EQ. 6}]$$

From this DC-DC converter current $I_{DCDC}$ and the known DC-DC converter voltage $V_{DCDC}$, the current DC-DC converter output power $P_{dout}$ of the DC-DC converter 330 may be determined, by the controller 115 or vehicle controller 120, as:

$$P_{dout} = I_{DCDC} * V_{DCDC} \quad [\text{EQ. 7}]$$

The DC-DC converter current $I_{dmax}$ and DC-DC converter power $P_{dmax}$ from the DC-DC converter 330 may be obtained from look-up tables, mathematical functions, or from a supplier based on known values.

Figure 4:
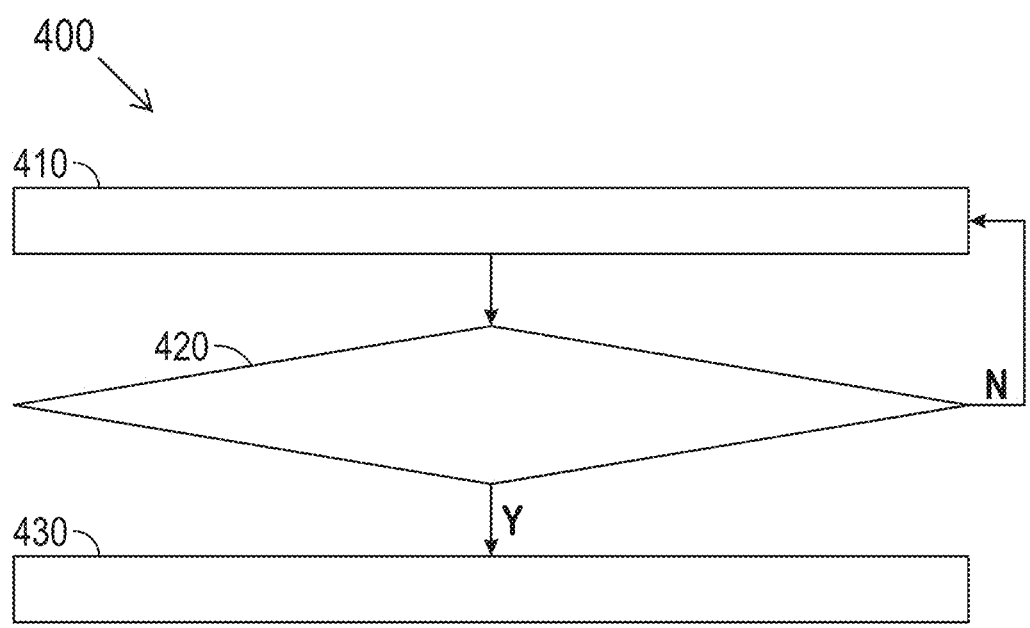
FIG. 4 is a process flow of a method of implementing accessory load control and power stability in a vehicle according to one or more embodiments.

FIG. 4 is a process flow of a method 400 of implementing accessory load control and power stability in a vehicle 100 according to one or more embodiments. The processes may be performed by the controller 115 of the power distribution system 110, by the vehicle controller 120, or by a combination of the two. At block 410, obtaining current values and battery and total current measurements refers to obtaining the values discussed with reference to FIGS. 2 and 3. Specifically, the current, power, maximum available current and maximum available power are obtained for a battery 210 and generator 230 or a battery 210 and DC-DC converter 330. The maximum available current is a sum of the maximum available battery current $I_{bmax}$ from EQ. 1 and the generator current $I_{Gen}$ from EQ. 4 (in the case of a gas-powered vehicle 100) or the DC-DC converter current $I_{DCDC}$ from EQ. 6.

At block 420, a check is done of whether the maximum available current is less than the current draw from the loads 130. If the maximum available current is greater than or equal to the current draw of the loads 130, then no action is taken by the controller 115 or vehicle controller 120, and monitoring of the values may continue at block 410. If the maximum available current is less than the current draw of the loads 130, then load management, including load shedding, may be implemented at block 430.

At block 430, if the check at block 420 indicates that the current draw by the loads 130 exceeds the maximum available current, then load management is performed. Load management, at block 430, may involve turning off one or more loads 130 based on a priority ranking of loads 130. That is, loads 130 may be associated with a priority level (e.g., high or low). Alternately, loads 130 may be ranked from loads 130 pertaining to high priority, safety related functions (e.g., battery management, brake system) to lower priority, convenience related functions (e.g., heated seats). When the maximum available current is less than the current draw from the loads 130 that are currently in operation, one or more lower priority loads 130 may be turned off.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects. Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof

What is claimed is:

1. A system in a vehicle comprising:
   memory configured to store values obtained for a battery that supplies current to one or more loads of the vehicle, the values including state of charge (SoC) of the battery; and
   a processor configured to obtain a measured battery current from a current sensor of the battery and a measured total current from a current sensor at a battery center configured to supply the current directly to the one or more loads, to obtain a generator current or a direct current-to-direct current (DC-DC) converter current from the measured total current and the battery current, to determine a maximum available current as a sum of a maximum available battery current and either the generator current or the DC-DC converter current, and to stop a supply of the current to one or more of the one or more loads based on a result of a comparison of the maximum available current with current draw by the one or more loads.

2. The system according to claim 1, wherein the processor is configured to determine the maximum available battery current $I_{bmax}$ based on battery internal resistance $R_{internal}$ and battery internal voltage $V_{oc}$ as:

$$I_{bmax} = \frac{V_{OC}}{2*R_{internal}}.$$

3. The system according to claim 2, wherein the processor is configured to obtain values of the battery internal resistance $R_{internal}$ and the battery internal voltage $V_{oc}$ from look-up tables based on current values of the SoC the p, temperature, and voltage.

4. The system according to claim 1, wherein the vehicle is gasoline or diesel-powered and the generator current is obtained as the battery current subtracted from the measured total current.

5. The system according to claim 1, wherein the vehicle is a hybrid vehicle and the DC-DC converter current is obtained as the battery current subtracted from the measured total current.

6. The system according to claim 1, wherein the vehicle is an electric vehicle and the DC-DC converter current is obtained as the battery current subtracted from the measured total current.

7. The system according to claim 1, wherein the processor is configured to associate a priority associated with each of the one or more loads.

8. The system according to claim 7, wherein the processor is configured to stop the supply of the current to one or more of the one or more loads based on the result of the comparison of the maximum available current with current draw by the one or more loads indicating that the maximum available current is less than the current draw by the one or more loads.

9. The system according to claim 7, wherein the processor is configured to select the one or more of the one or more loads based on the priority associated with the one or more of the one or more loads.

10. The system according to claim 1, wherein the processor is configured to continue the supply of the current to others of the one or more loads, other than the one or more of the one or more loads, based on the others of the one or more loads affecting safety of the vehicle.

11. A non-transitory computer-readable medium configured to store instructions that, when processed by a processor, cause the processor to implement a method in a vehicle, the method comprising:
    obtaining a measured battery current from a current sensor of a battery and a measured total current from a current sensor at a battery center configured to supply the current directly to one or more loads;
    obtaining a generator current or a direct current-to-direct current (DC-DC) converter current from the measured total current and the measured battery current;
    determining a maximum available current as a sum of a maximum available battery current and either the generator current or the DC-DC converter current; and
    controlling a stop of supply of the current to one or more of the one or more loads based on a result of a comparison of the maximum available current with current draw by the one or more loads.

12. The non-transitory computer-readable medium according to claim 11, wherein the method includes determining the maximum available battery current $I_{bmax}$ based on battery internal resistance $R_{internal}$ and battery internal voltage $V_{oc}$ as:

$$I_{bmax} = \frac{V_{OC}}{2*R_{internal}}.$$

13. The non-transitory computer-readable medium according to claim 12, wherein the method includes obtaining values of the battery internal resistance $R_{internal}$ and the battery internal voltage $V_{oc}$ from look-up tables based on current values of the SoC the p, temperature, and voltage.

14. The non-transitory computer-readable medium according to claim 11, wherein the method includes obtaining the generator current as the battery current subtracted from the measured total current in a gasoline or diesel-powered vehicle.

15. The non-transitory computer-readable medium according to claim 11, wherein the method includes obtaining the DC-DC converter current as the battery current subtracted from the measured total current in a hybrid vehicle.

16. The non-transitory computer-readable medium according to claim 11, wherein the method includes obtaining the DC-DC converter current as the battery current subtracted from the measured total current in an electric vehicle.

17. The non-transitory computer-readable medium according to claim 11, wherein the method includes associating a priority with each of the one or more loads.

18. The non-transitory computer-readable medium according to claim 17, wherein the method includes stopping the supply of the current to one or more of the one or more loads based on the result of the comparison of the maximum available current with current draw by the one or more loads indicating that the maximum available current is less than the current draw by the one or more loads.

19. The non-transitory computer-readable medium according to claim 17, wherein the method includes selecting the one or more of the one or more loads based on the priority associated with the one or more of the one or more loads.

20. The non-transitory computer-readable medium according to claim 11, wherein the method includes continuing the supply of the current to others of the one or more loads, other than the one or more of the one or more loads, based on the others of the one or more loads affecting safety of the vehicle.

* * * * *